United States Patent [19]

Fukuda

[11] Patent Number: 5,315,138
[45] Date of Patent: May 24, 1994

[54] SEMICONDUCTOR MEMORY APPARATUS
[75] Inventor: Takeshi Fukuda, Kanagawa, Japan
[73] Assignee: NEC Corporation, Tokyo, Japan
[21] Appl. No.: 826,419
[22] Filed: Jan. 27, 1992
[30] Foreign Application Priority Data
  Jan. 25, 1991 [JP] Japan .................. 3-025506
[51] Int. Cl.⁵ ............................ H01L 29/92
[52] U.S. Cl. .................. 257/296; 257/202; 257/390; 257/922
[58] Field of Search .......... 257/910, 390, 296, 922, 257/202, 204, 205, 208, 210

[56] References Cited

U.S. PATENT DOCUMENTS 4,926,224  5/1990  Redwine ..................... 257/910
4,941,031  7/1990  Kumagai et al. ............. 257/910

Primary Examiner—Sara W. Crane
Attorney, Agent, or Firm—Sughrue, Mion, Zinn, Macpeak & Seas

[57] ABSTRACT

A semiconductor memory apparatus according to the present invention consists of memory cell forming regions, each formed in a rectangular plane form, a plurality of bit line pairs connected to a plurality of memory cells arranged and formed in these memory cell forming regions, and first and second peripheral circuits formed outside said memory cell forming regions, wherein said first and second peripheral circuits are formed and arranged symmetrically with respect to the point of intersection of two centerlines connecting the middle points of two opposite ones of the four sides of each of said memory cell forming regions, and said bit line pairs are connected to the first and second peripheral circuits. This configuration makes it possible to match the constituent elements of the peripheral circuits with each other and balance the bit line pairs, and thereby to prevent the drop in writing or reading rate and erroneous operations, to which semiconductor memory apparatuses according to the prior art are susceptible.

6 Claims, 7 Drawing Sheets

SEMICONDUCTOR MEMORY APPARATUS

BACKGROUND OF THE INVENTION

1. Field of the Invention

The present invention relates to a semiconductor apparatus, and more particularly to the arrangement of circuits peripheral to a dynamic random access memory (DRAM).

2. Description of the Prior Art

Usually a semiconductor memory apparatus, such as a DRAM, consists of memory cell array forming sections, formed by arranging memory cells, and peripheral circuits adjacent to it, including sense amplifiers, row decoders and column decoders. Among these peripheral circuits, specific items such as sense amplifiers, one of which is provided for each pair of bit lines to each of which is supplied to a voltage in a complementary relationship to each one of a plurality of bit lines constituting the memory cell array, have to be installed at a rate of one unit per pair of bit lines. Therefore, these specific peripheral circuits are arranged along a side of said memory cell array forming sections.

In recent years, microprocessing techniques for semiconductors have made remarkable progress, resulting in a reduction in the area in which each bit of said memory cell is formed on a single semiconductor chip with a corresponding reduction in the pitch of the repetitive arrangement of each of bit line pairs connected to a plurality of said memory cells on said semiconductor chip.

Meanwhile, so-called specialized semiconductor memories embodying the application to functions unique to a particular system, typically including picture memories, have become commercially available and are extensively used. In such a specialized semiconductor memory, peripheral circuits for such system functions as serial data transfer and flash clear should be provided for each pair of said bit lines in order to realize these functions on said semiconductor chip. Thus, peripheral circuits used for said specialized semiconductor memory include line buffer circuits and serial switching circuits in addition to said sense amplifiers, resulting in a complex and large-scale configuration. Accordingly, it has become difficult to arrange these peripheral circuits along a side of said memory cell array forming sections at the repetitive pitch of said bit line pairs. Should said peripheral circuits be arranged in disregard of said repetitive pitch, the characteristics of transistors, which are the constituent elements of the peripheral circuits, would become unmatched, and moreover said bit line pairs would be laid in an elongated state, resulting in large resistances and capacities added to the bit line pairs.

This would have the consequence, as voltage variations on the bit line pairs are delayed when signals are read or written, of not only significantly slowing down the reading and writing rates of the semiconductor memory apparatus but also inviting erroneous operations.

SUMMARY OF THE INVENTION

Therefore an object of the present invention is to provide a semiconductor memory apparatus which is freed from a slowdown in writing and reading rates and the occurrence of erroneous operations by arranging its peripheral circuits by matching the characteristics of their constituent elements and balancing the lengths of bit line pairs.

According to the invention, there is provided a semiconductor memory apparatus having on the surface of a semiconductor substrate:

memory cell forming regions, each of a rectangular plane shape surrounded by first and second edges extending in a first direction and third and fourth edges extending in a second direction at a right angle to said first direction;

memory cell forming sections in each of which a plurality of said memory cell forming regions are arranged in said first direction;

a plurality of memory cells arranged and formed in each of said memory cell forming regions;

first and second bit line pairs connecting respectively corresponding ones of said plurality of memory cells in said memory cell forming regions and formed extending in said second direction in said regions;

first peripheral circuits formed outside said memory cell forming regions along and opposite to said first edge and having first and second connecting points; and second peripheral circuits formed outside said memory cell forming regions along and opposite to said second edge and having first and second connecting points; wherein said first and second peripheral circuits are arranged and formed symmetrically with respect to the point of intersection between a first centerline connecting the middle point of said first edge and that of said second edge and a second center line connecting the middle point of said third edge and that of said fourth edge, each of said first bit line pairs being connected to said first and second connecting points of each of said first peripheral circuits and each of said second bit line pairs being connected to said first and second connecting points of each of said second peripheral circuits.

There may further be arranged a plurality of mutually adjoining first and second peripheral circuits, respectively in orthogonal symmetry.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENTS

Figure 1:
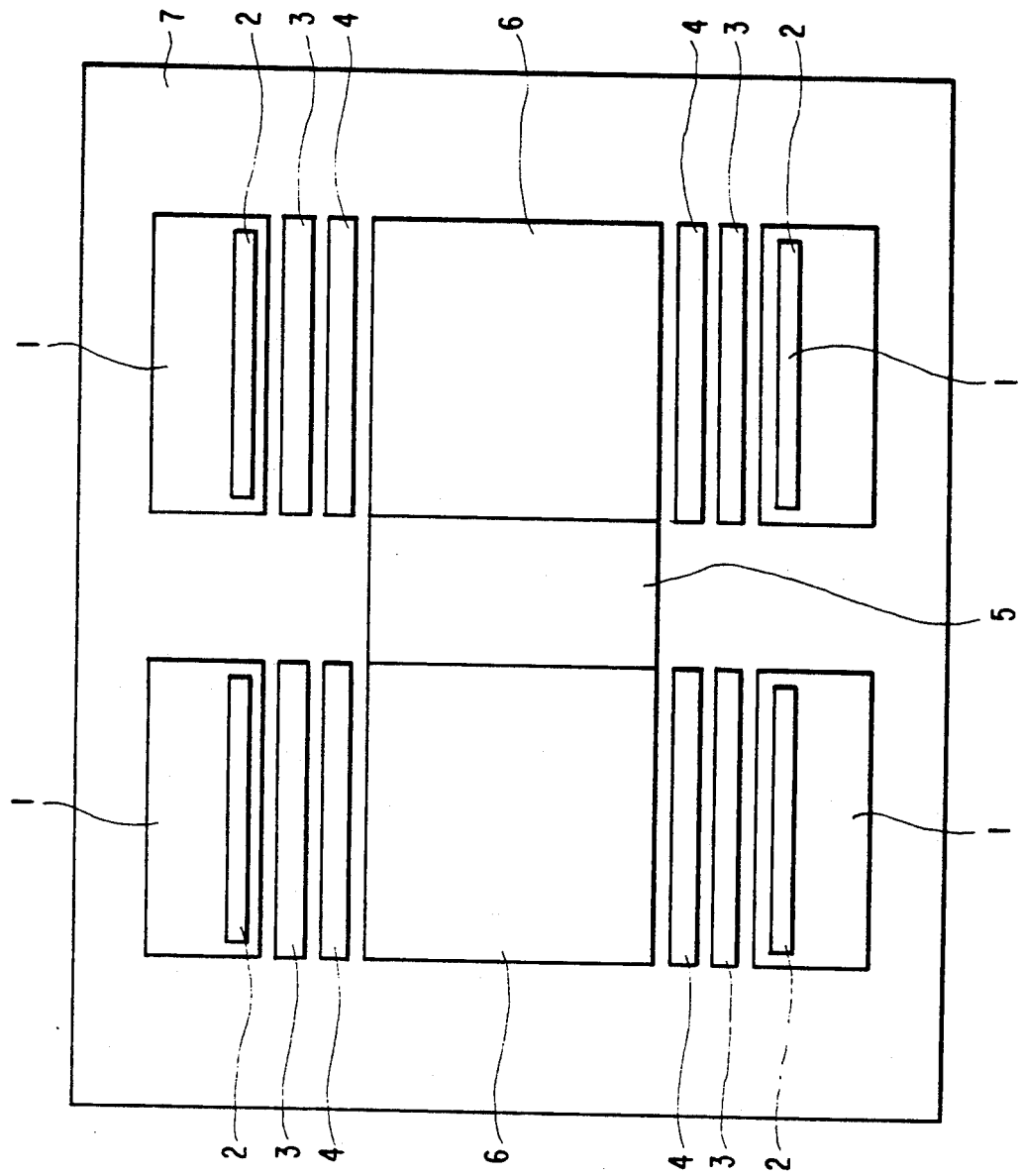
FIG. 1 shows a schematic plan of a semiconductor memory apparatus in its entirety, which is a first preferred embodiment of the invention.

Referring to FIG. 1, a semiconductor chip 7 constituting a semiconductor memory apparatus, which is a first preferred embodiment of the present invention, involves memory cell forming sections 6 in which memory cells are arranged in arrays, a row decoder 5 which selects a word line according to the input address, bit line balancing circuits 3 which balance each bit line pair at the same potential, bit line potential supplying circuits 4, and peripheral circuit sections 1 each having a sense amplifier 2 (although this semiconductor memory apparatus also has other circuits in its peripheral circuit sections, they are not referred to here for the convenience of description).

Each peripheral circuit section 1 containing a sense amplifier 2 is arranged close to a memory cell forming section 6 because it is connected to a bit line pair making up a part of the memory cell forming section 6. More specifically, peripheral circuit sections 1 are arranged along two mutually parallel sides of the memory cell forming section 6 and outside the memory cell forming section 6.

Figure 2:
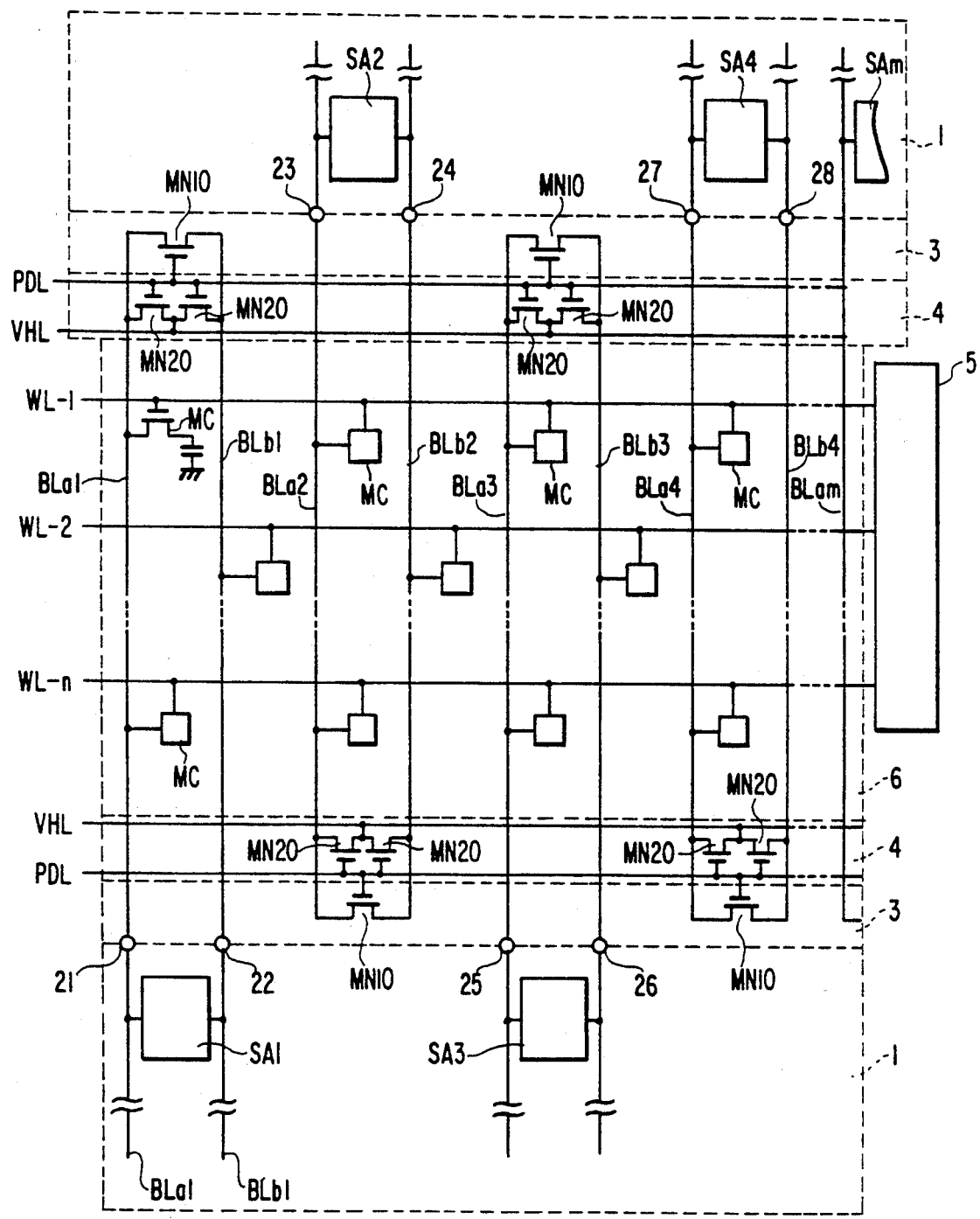
FIG. 2 is a circuit diagram illustrating the specific circuit configuration of the semiconductor memory apparatus shown in FIG. 1.

Now referring to FIG. 2 together, a memory cell forming section 6 in this preferred embodiment consists of a plurality of memory cells (MC's) arranged in an array, each cell comprising an N-channel transistor and a capacity element (i.e. it is formed by arranging so-called one-transistor one-capacitor type MC's in an array). To each MC are connected a word line (such as WL-1, WL-2, ... or WL-n) and a pair of bit lines (such as BLa1/BLb1, BLa2/BLb2, ... or BLam/BLbm).

Each of said bit line pairs are connected to a peripheral circuit section 1 at some or others of connection points 21 through 28. A sense amplifier SA (such as SA1, SA2, ... or the like) involved in the peripheral circuit section 1 consists of a flip-flop type circuit, balanced between two sides in terms of transistor characteristics and floating capacity among others.

Figure 3:
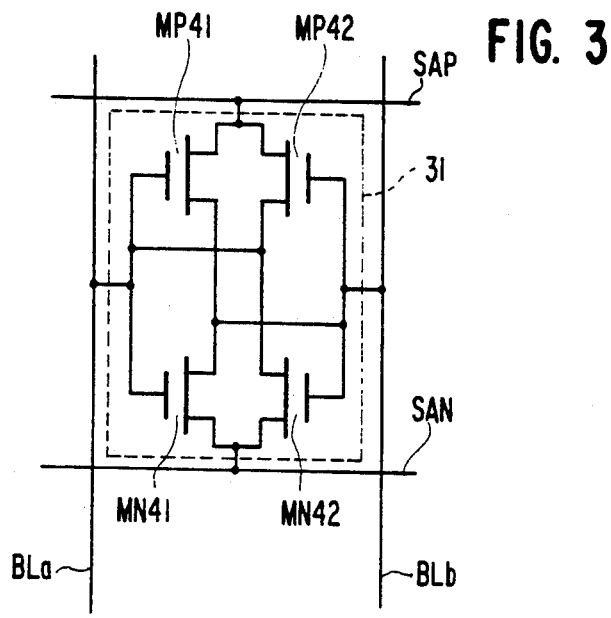
FIG. 3 is a circuit diagram illustrating the circuit configuration of a sense amplifier.

Referring further to FIG. 3 together, a P-channel transistor MP41 and an N-channel transistor MN41 constitute a first inverter circuit, a P-channel transistor MP42 and an N-channel transistor MN42 constitute a second inverter circuit, and a flip-flop is composed by feeding back the outputs of the first and second inverter circuits to the inputs of the second and first inverter circuits. To the input of each of the first and second inverter circuits are connected a pair of bit lines BLa and BLb to constitute a sense amplifier 31.

Figure 4:
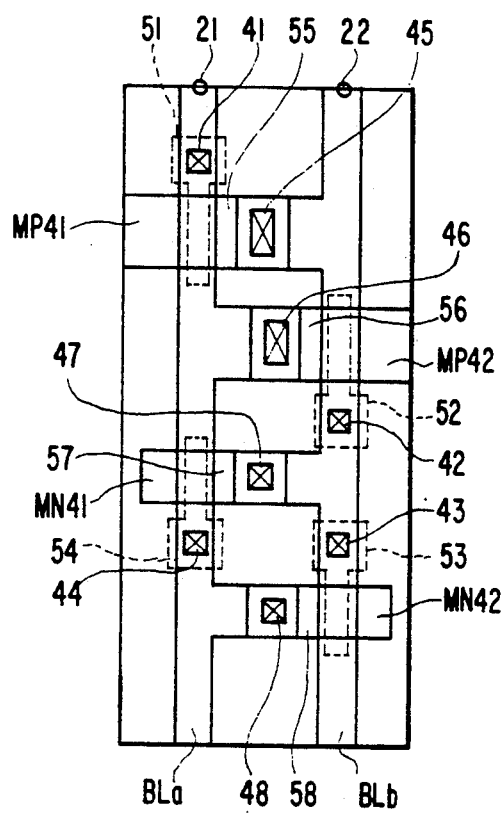
FIG. 4 is a plan schematically illustrating a part of the arrangement pattern of the sense amplifier shown in FIG. 3.

To describe the arrangement of this sense amplifier 31 on the semiconductor chip with reference to FIG. 4, the gate electrode 51, formed of a polysilicon membrane, of the transistor MP41 is connected through a contact hole 41 to metallic wiring which forms the bit line BLa, and the source-drain path of the same transistor MP41 is connected through a contact hole 45 to metallic wiring which forms the bit line BLb and a signal line SAP. The transistor MP42 is arranged matched with said transistor MP41. Its gate electrode 52, formed of a polysilicon membrane, is connected through a contact hole 42 to metallic wiring which forms the bit line BLb, and its source-drain path is connected through a contact hole 46 to metallic wiring which forms the bit line BLa and the signal line SAP. Further, the gate electrode 54, formed of a polysilicon membrane, of the transistor MN41 is connected through a contact hole 44 to said bit line BLa, and the source-drain path of the same transistor MN41 is connected through a contact hole 47 to the bit line Blb and a signal line SAN. The transistor MN42, too, is arranged matched with said transistor MN4, with its electrode 53, formed of a polysilicon membrane, connected through a contact hole 43 to the bit line BLb, and its source-drain path connected through a contact hole 48 to said bit line BLa and the signal line SAN.

The sense amplifier 31 is formed on the semiconductor chip in an arrangement matching the bit line pairs BLa and BLb. This sense amplifier 31 operates as appropriate potentials are given to the signal lines SAP and SAN by activating signals (not shown).

Figure 5:
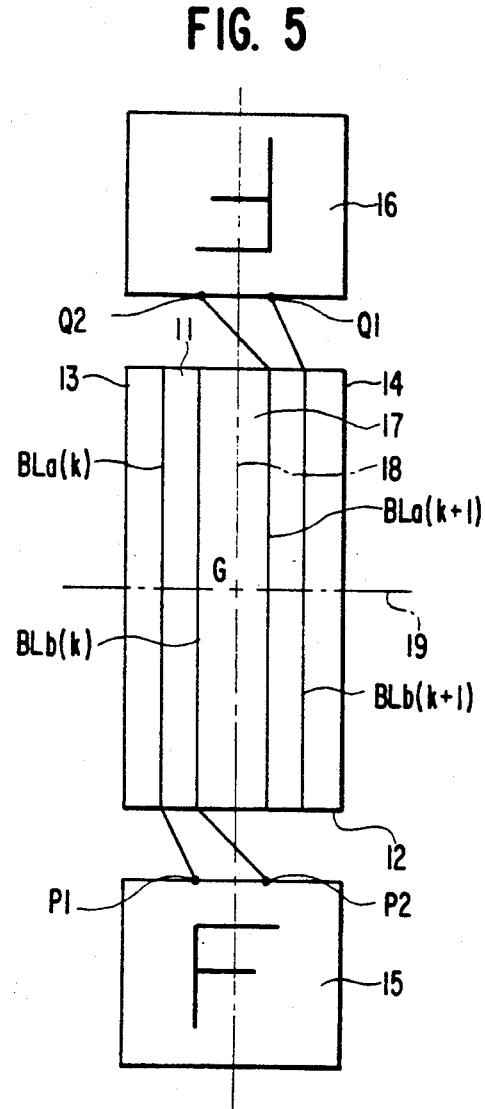
FIG. 5 is a plan illustrating the arrangement of the peripheral circuits, memory cell forming regions and bit line pairs of the semiconductor memory apparatus, shown in FIG. 1, on a chip.

Next, to describe the detailed arrangement of the semiconductor memory apparatus, which is the first preferred embodiment of the present invention, with reference to FIG. 5, peripheral circuits 15 and 16 both corresponding to a memory cell forming region 17 involving the (k+1)th bit line pairs BLa(k+1) and Blb(k+1), respectively adjoining the kth bit line pairs BLa(k) and BLb(k) in FIG. 2, are arranged outside the memory cell forming region 17 along edges 12 and 11, respectively, of the region 17. Further, said peripheral circuits 15 and 16 are formed in a symmetric arrangement with respect to the intersection point G of centerlines 18 and 19, respectively connecting the middle points of the edges 11 and 12 and those of edges 13 and 14. The bit line pairs BLa (k) and BLb(k) are connected to the peripheral circuit 15 via connecting points P1 and P2 on a side of the peripheral circuit 15 opposite to said memory cell forming region 17. Similarly, the bit line pairs BLa (k+1) and Blb(k+1) are connected to the peripheral circuit 16 via connecting points Q1 and Q2 on a side of the peripheral circuit 16 opposite to said memory cell forming region 17. With the arrangement direction of the peripheral circuit 15 being represented by ⊣ that of the peripheral circuit is represented by (see FIG. 5).

Figure 6:
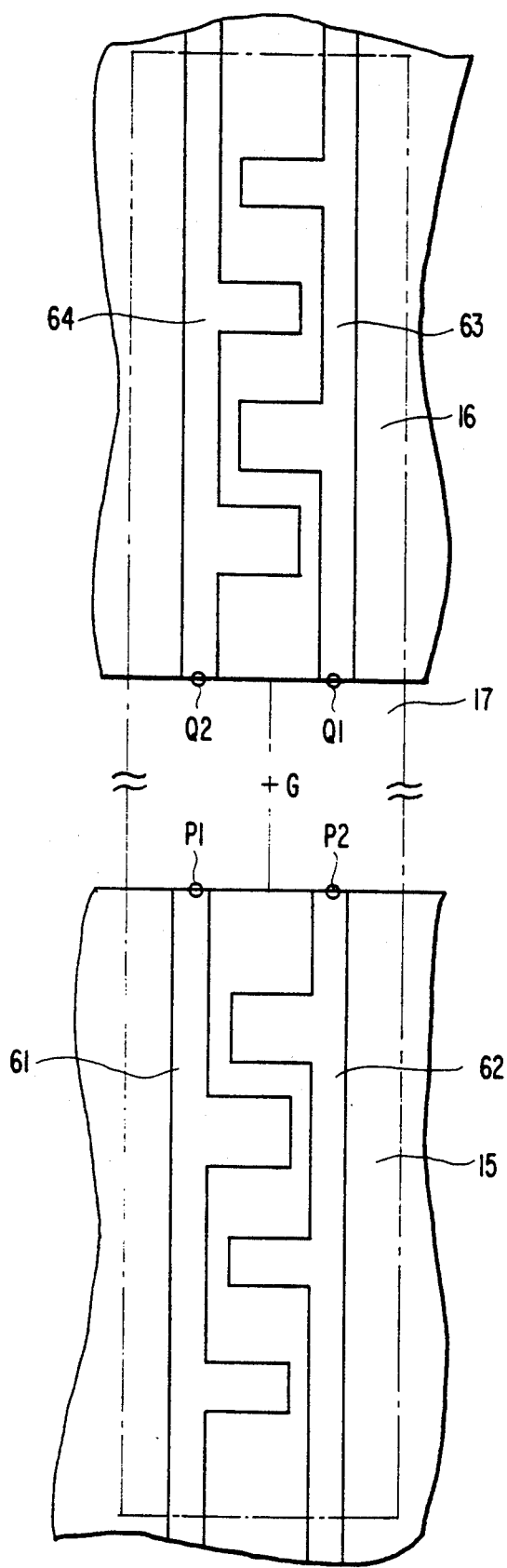
FIG. 6 is a plan illustrating a part of the arrangement pattern of the peripheral circuits of the semiconductor memory apparatus shown in FIG. 3.

FIG. 6 is a plan illustrating a part of the arrangement pattern, corresponding to FIG. 4, of a case in which the peripheral circuits 15 and 16 of FIG. 5 involve sense amplifiers 31 of FIG. 3. The same constituent parts as in FIG. 5 are assigned respectively the same reference numerals or codes.

The metallic wiring patterns 61 and 62 of the sense amplifier involved in the peripheral circuit 15 are connected to the connecting points P1 and P2, and the metallic wiring patterns 63 and 64 of the sense amplifier involved in the peripheral circuit 16 are connected to the connecting points Q1 and Q2, the metallic wiring patterns 61 and 63 and the metallic wiring patterns 62 and 64 being respectively arranged symmetrically with respect to the intersection point G.

Now, referring again to FIG. 2, when this semiconductor memory apparatus is in reading operation, precharge signals (not shown) shift a signal line PDL from a high to a low level and turn off transistors MN10 and MN20. After that, a word line WL-i selected by the row decoder 5 is activated. The stored contents of a plurality of MC's connected to the word line WL-i are supplied to the corresponding bit line pair. Either one of paired bit lines BLak and BLbk is reduced in potential to below that of a power supply line VHL according to the stored content of the MC, and the potential of the other is equalized to that of said power supply line VHL (if a low level is stored in the MC). This difference in potential between the paired bit lines is amplified by a sense amplifier (SA), and the reading operation for one stored content is completed by sending out the amplified difference to an output circuit (not shown) through a bit line pair selected by a column decoder (not shown).

Figure 7:
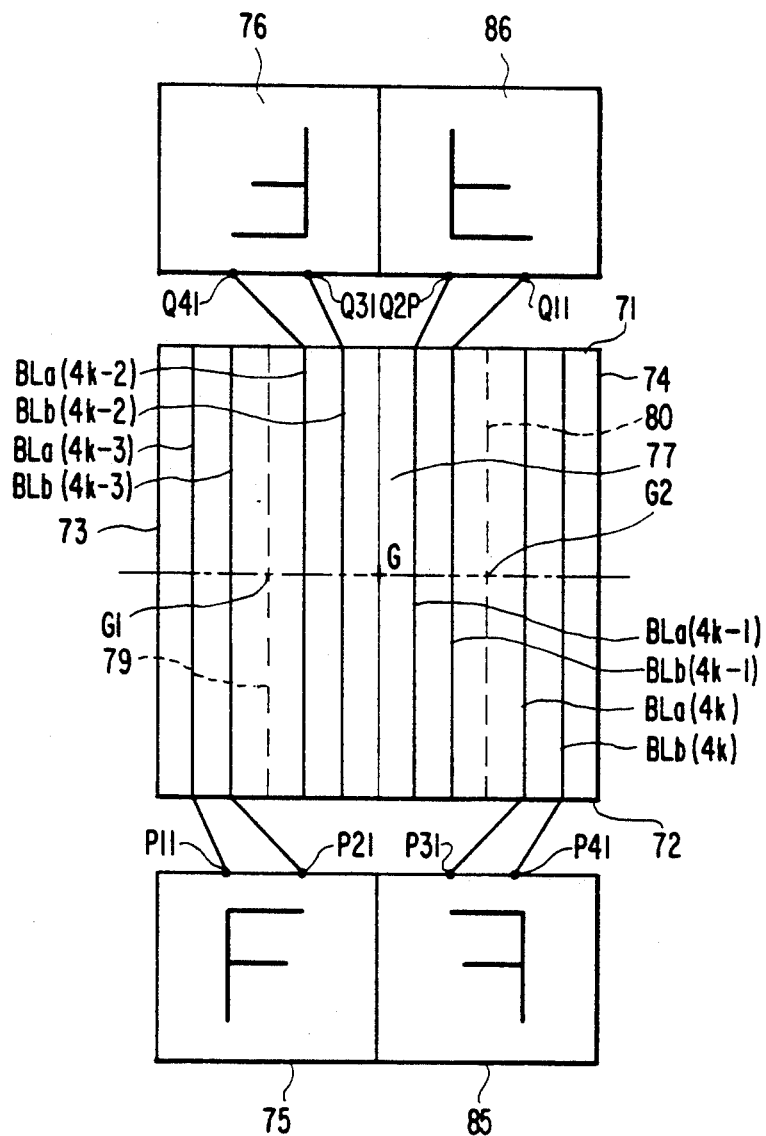
FIG. 7 is a plan illustrating the arrangement of the peripheral circuits, memory cell forming regions and bit lines of the semiconductor memory apparatus, which is a second preferred embodiment of the invention, on a chip.

Next to describe the arrangement of the semiconductor memory apparatus illustrated in FIG. 7, which is a second preferred embodiment of the present invention, peripheral circuits 75, 76, 85 and 86 corresponding to a memory cell forming region 77 involving the (4k-3)th, (4k-2)th, (4k-1)th and 4kth bit line pairs (BLa(4k-3)/BLb(4k-3), BLa(4k-2)/BLb(4k-2), BLa(4k-1)/BLb(4k-1) and BLa(4k)/BLb(4k) are formed outside the memory cell forming region 77 along edges 72 and 71 of the region 77. Said peripheral circuits 75 and 76 are symmetrically arranged with respect to the intersection point G1 of a memory cell forming region 79 involving the (4k-3)th and (4k-2)th bit line pairs. Similarly, the peripheral circuits 85 and 86 are symmetrically arranged with respect to the intersection point G2 of a memory cell forming region 80 involving the (4k-1)the and 4kth bit line pairs. Further, said peripheral circuits 75 and 85 and said peripheral circuits 76 and 86 are symmetrically arranged with respect to the intersection point G of the memory cell forming region 77 involving these four bit line pairs. Thus the peripheral circuits 75 and 85 and the peripheral circuits 76 and 86 are symmetrically formed with respect to a centerline which passes the intersection point G and is parallel to said edge 74 or 73.

The arrangement of the formation will now be described more specifically with reference to FIG. 8.

Figure 8:
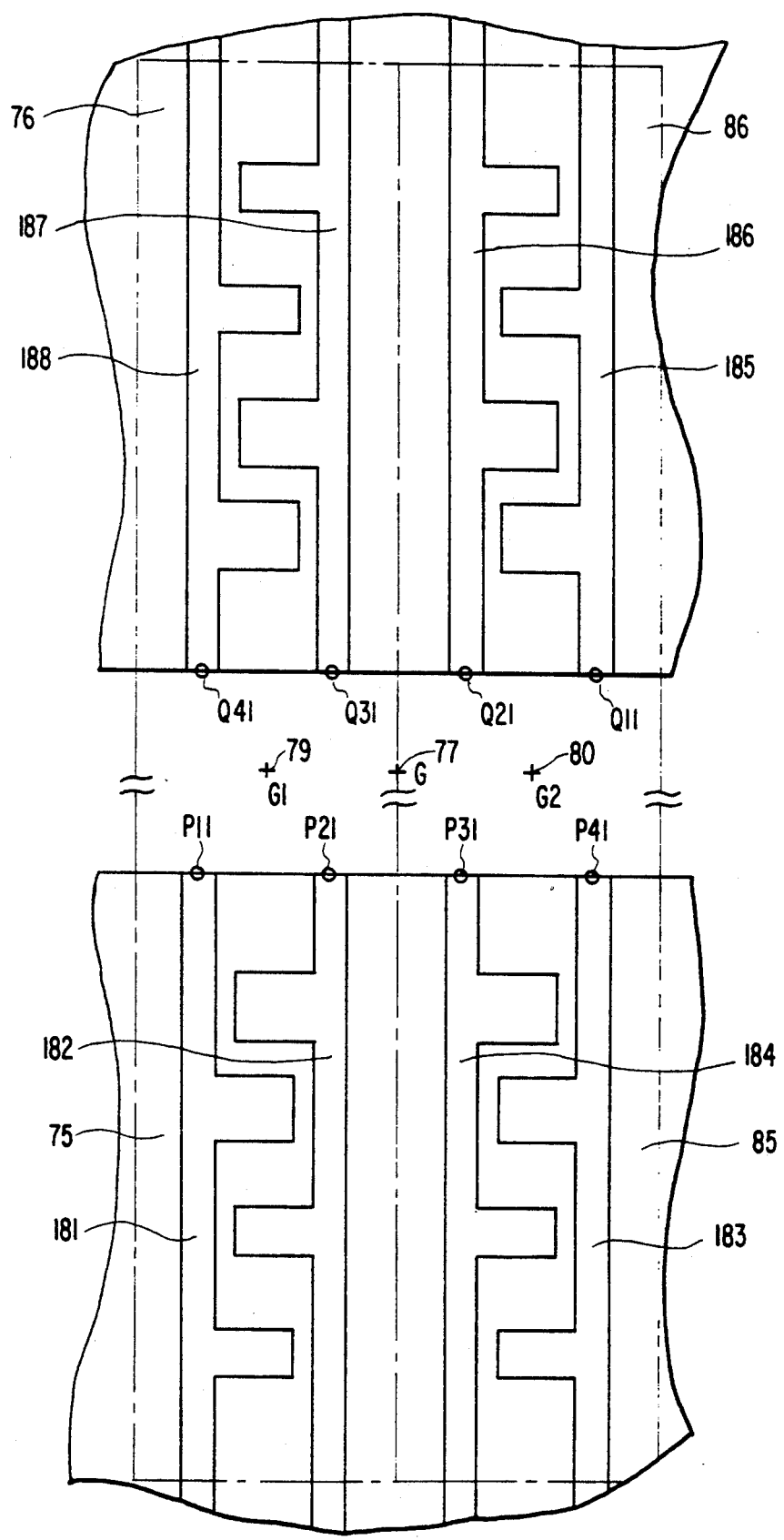
FIG. 8 is a plan illustrating a part of the arrangement pattern of the peripheral circuits of the semiconductor memory apparatus shown in FIG. 7.
Figure 9:
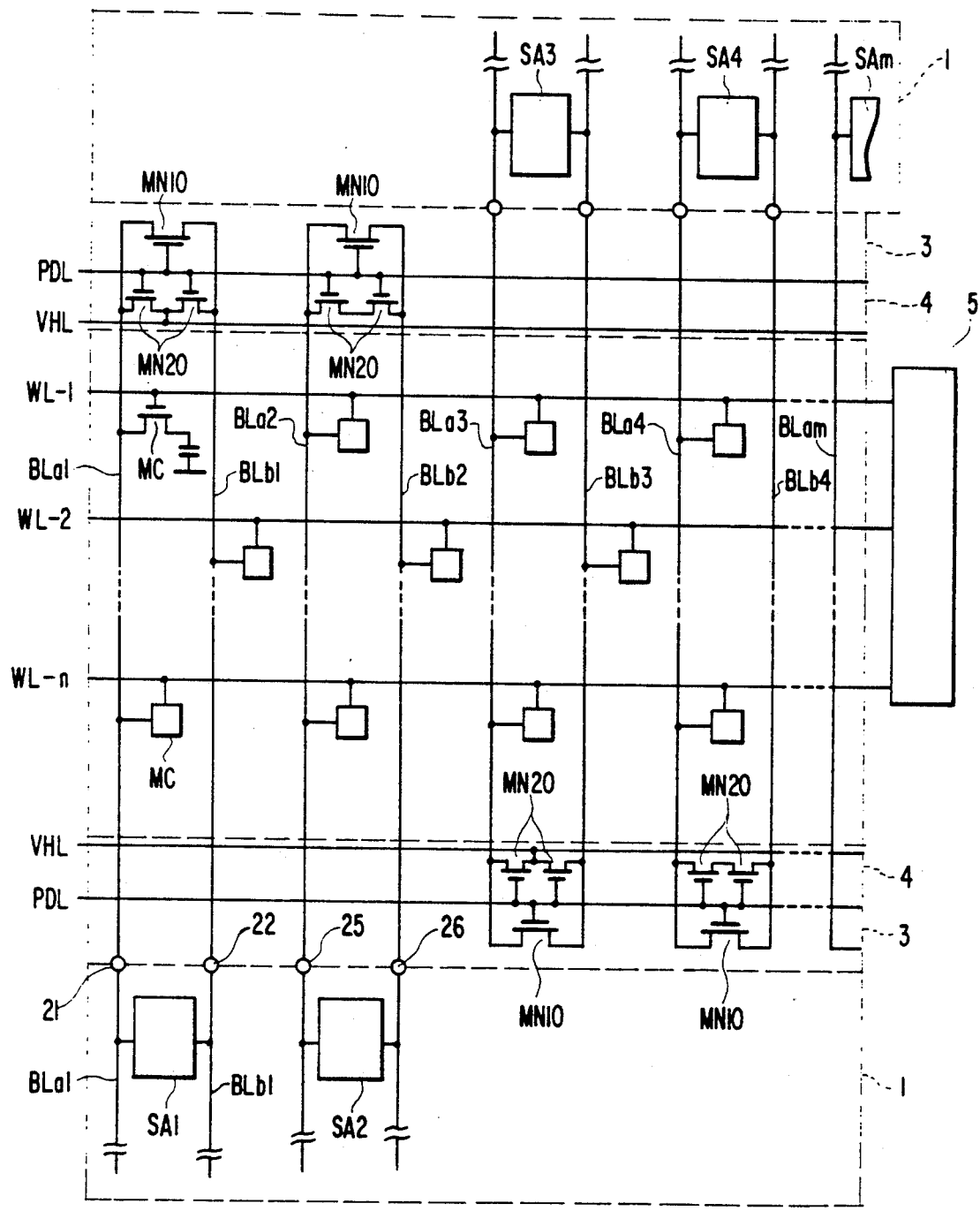
FIG. 9 is a circuit diagram illustrating the specific circuit configuration of the semiconductor memory apparatus, which is a second preferred embodiment of the invention.

FIG. 8 is a plan illustrating a part of the arrangement pattern, corresponding to FIG. 4, of a case in which the peripheral circuits 75, 76, 85 and 86 of FIG. 7 involve sense amplifiers 31 of FIG. 3. The same constituent parts as in FIG. 7 are assigned respectively the same reference numerals or codes.

The metallic wiring patterns 181, 182, 183 and 184 of the sense amplifiers involved in the peripheral circuits 75 and 85 are connected to the connecting points P11, P21, P31 and P41, and the metallic wiring patterns 185, 186, 187 and 188 of the sense amplifiers involved in the peripheral circuits 76 and 86 are connected to the connecting points Q11, Q21, Q31 and Q41, the metallic wiring patterns 181, 182, 183 and 184 and the metallic wiring patterns 185, 186, 187 and 188 being respectively arranged symmetrically with respect to the intersection point G.

This semiconductor memory apparatus, which is the second preferred embodiment of the invention, can be composed in an arrangement of formation in which peripheral circuits connected to consecutive four-bit bit line pairs are positioned at the top and bottom of the memory forming section, with each set comprising two bits.

As the reading operation of this second embodiment is the same as that of the first embodiment, its description is dispensed with here.

As hitherto described, if specific peripheral circuits one of which has to be provided for each bit line pair are symmetrically arranged with respect to the intersection point of centerlines of the memory cell forming region, the constituent elements including sense amplifiers can be well matched with each other and so can be bit line pairs, making it possible to realize an error-free semiconductor memory apparatus, suffering no substantial drop in reading or writing rate. The response rate of the bit line pairs of a picture memory, for instance, according to the invention would be about 25 ns higher than that by the prior art, which means that a higher speed picture memory can be materialized.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A semiconductor memory device comprising, on the surface of a semiconductor substrate:
   a plurality of memory cell forming regions each having a rectangular plane shape defined by first and second sides extending in a first direction and third and fourth sides extending in a second direction at a right angle to said first direction, said memory cell forming regions being arranged in line in said first direction;
   a plurality of memory cells arranged and formed in each of said memory cell forming regions;
   first and second bit line pairs formed in each of said memory cell forming regions and extending in said second direction;
   a plurality of first peripheral circuits arranged in said first direction, each of said first peripheral circuits being formed outside said first side of an associated one of said memory cell forming regions and having first and second connecting points connected to said first bit line pair; and
   a plurality of second peripheral circuits arranged in said first direction, each of said second peripheral circuits being formed outside said second side of an associated one of said memory cell forming regions and having third and fourth connecting points connected to said second bit line pair;
   each of said first peripheral circuits being shifted toward said second bit line pair along said first side to have said first connecting point on a left side of a line crossing a center of said first side and a center of said second side and said second point on a right side of said line, and each of said second peripheral circuits being shifted toward said first bit line pair along said second side to have said third connecting point on the left side of said line and said fourth connecting point on the right side of said line.

2. A semiconductor memory device, as claimed in claim 1, wherein each of said first and second peripheral circuits includes a sense amplifier.

3. A semiconductor memory device comprising:
   a memory cell region defined by first and second sides extending in a first direction and third and fourth sides extending in a second direction perpendicular to said first direction, a first bit line pair formed in said memory cell region and having first and second bit lines running parallel to each other in said first direction, a second bit line pair formed in said memory cell region and having third and fourth bit lines running parallel to each other in said first direction, a first sense amplifier formed adjacent to said third side of said memory cell region and having first and second terminals connected to said first and second bit lines of said first bit line pair, respectively, and a second sense amplifier formed adjacent to said fourth side of said memory cell region and having third and fourth terminals connected to said third and fourth bit lines of said second bit line pair, respectively, said first sense amplifier being shifted toward said second bit line pair along said third side and said second sense amplifier being shifted toward said first bit line pair along said fourth side such that said first and second sense amplifiers are arranged in line in said first direction.

4. The semiconductor memory device as claimed in claim 3, wherein said first bit line pair is disposed on a left side of a line crossing a center of said third side and a center of said fourth side, said second bit line pair being disposed on a right side of said line, said first terminal of said first sense amplifier and said third terminal of said second sense amplifier being disposed on the left side of said line, and said second terminal of said first sense amplifier and said fourth terminal of said second sense amplifier being disposed on the right side of said line.

5. A semiconductor memory device comprising:

a memory cell region defined by first and second sides extending in a first direction and third and fourth sides extending in a second direction perpendicular to said first direction, a first bit line pair formed in said memory cell region adjacent to said first side and having first and second bit lines running parallel to each other in said first direction, a second bit line pair formed in said memory cell region adjacent to said second side and having third and fourth bit lines running in parallel to each other in said first direction, a third bit line pair formed in said memory cell region between said first bit line pair and said second bit line pair and having fifth and sixth bit lines running parallel to each other in said first direction, a fourth bit line pair formed in said memory cell region between said second bit line pair and said third bit line pair and having seventh and eighth bit lines running parallel to each other in said first direction, a first sense amplifier formed adjacent to said third side of said memory cell region and having first and second terminals connected to said first and second bit lines of said first bit line pair, respectively, a second amplifier formed adjacent to said third side of said memory cell region and having third and fourth terminals connected to said third and fourth bit lines of said second bit line pair, respectively, a third sense amplifier formed adjacent to said fourth side of said memory cell region and having fifth and sixth terminals connected to said fifth and sixth bit lines of said third bit line pair, respectively, a fourth sense amplifier formed adjacent to said fourth side of said memory cell region and having seventh and eight terminals connected to said seventh and eighth bit lines of said fourth bit line pair, respectively, said first sense amplifier being shifted toward said third bit line pair along said third side and said third sense amplifier being shifted toward said first bit line pair along said forth said such that said first and third sense amplifiers are arranged in line in said first direction, and said second sense amplifier being shifted toward said fourth bit line pair along said third side and said fourth sense amplifier being shifted toward said second bit line pair along said fourth side such that said second and fourth sense amplifier are arranged in line in said first direction.

6. The semiconductor memory device as claimed in claim 5, wherein said first sense amplifier has said first terminal on a left side of a first line extending in said first direction between said first and third bit line pairs and said second terminal on a right side of said first line, said third sense amplifier having said fifth terminal on the left side of said first line and said sixth terminal on the right side of said first line, said second sense amplifier having said third terminal on a left side of a second line extending in parallel to said first line in said first direction between said second and fourth bit line pairs and said fourth terminal on a right side of said second line, and said fourth sense amplifier having said seventh terminal on the left side of said second line and said eighth terminal on the right side of said second line.

* * * * *

UNITED STATES PATENT AND TRADEMARK OFFICE
CERTIFICATE OF CORRECTION

PATENT NO. : 5,315,138
DATED : May 24, 1994
INVENTOR(S) : Takeshi FUKUDA

It is certified that error appears in the above-indentified patent and that said Letters Patent is hereby corrected as shown below:

Col. 4, line 45, delete "J" and insert --F--;
Col. 4, line 46, before "(See Fig. 5)." insert --J --.
Col. 5, line 29, delete "the" and insert --th--.

Signed and Sealed this

Twenty-ninth Day of November, 1994

Attest:

BRUCE LEHMAN

*Attesting Officer*   *Commissioner of Patents and Trademarks*